United States Patent
Andreev et al.

(10) Patent No.: US 7,194,717 B2
(45) Date of Patent: Mar. 20, 2007

(54) COMPACT CUSTOM LAYOUT FOR RRAM COLUMN CONTROLLER

(75) Inventors: Alexander E. Andreev, San Jose, CA (US); Ivan Pavisic, San Jose, CA (US); Anatoli Bolotov, Cupertino, CA (US)

(73) Assignee: LSI Logic Corporation, Milpitas, CA (US)

( * ) Notice: Subject to any disclaimer, the term of this patent is extended or adjusted under 35 U.S.C. 154(b) by 205 days.

(21) Appl. No.: 10/936,202

(22) Filed: Sep. 8, 2004

(65) Prior Publication Data

US 2006/0085777 A1 Apr. 20, 2006

(51) Int. Cl.
*G06F 17/50* (2006.01)

(52) U.S. Cl. .............................................. 716/9; 716/14

(58) Field of Classification Search ............... 716/8–10, 716/12–14
See application file for complete search history.

(56) References Cited

U.S. PATENT DOCUMENTS

| | | | |
|---|---|---|---|
| 5,359,538 A * | 10/1994 | Hui et al. ........................ 716/9 |
| 6,804,811 B2 * | 10/2004 | Andreev et al. ............... 716/12 |
| 6,948,145 B2 * | 9/2005 | Brown et al. .................. 716/12 |

* cited by examiner

*Primary Examiner*—Stacy A Whitmore
(74) *Attorney, Agent, or Firm*—Suiter Swantz PC LLO (57) ABSTRACT

The present invention provides a layout method for a top module including instances of a base module in a memory matrix such as a RRAM memory matrix, and the like. The top module and the base module may each include data pins and at least one control pin, or the top module and the base module may each include data pins only and may not include any control pins. The data pins of the instances of the base module are replicated in the top module. When at least one control pin is included in the top module and the base module, a control signal may be shared among the instances of the base module and the top module by tying together corresponding control pins of the instances and a corresponding control pin of the top module. The present method may include steps as follows. At a library preparation stage, data pins (and control pins, if applicable) of standard cells in the top module are extended vertically for easy access. Then, positions for the data pins of the top module (and at least one control pin, if applicable) of the top module are assigned in the top module. The instances are arranged within the top module. Signal routing for the instances and the top module are implemented. Power routing is performed for the instances and the top module.

27 Claims, 5 Drawing Sheets

COMPACT CUSTOM LAYOUT FOR RRAM COLUMN CONTROLLER

FIELD OF THE INVENTION

The present invention generally relates to the field of integrated circuits, particularly to compact custom layout algorithms for a class of modules (e.g., RRAM column controllers) found in a memory matrix (e.g., a RRAM memory matrix).

BACKGROUND OF THE INVENTION

Platform-based IC (integrated circuit) design is a powerful concept for coping with the increased pressure on time-to-market, design and manufacturing costs encountered in the current IC market. A platform is a large-scale, high-complexity semiconductor device that includes one or more of the following elements: (1) memory; (2) a customizable array of transistors; (3) an IP (intellectual property) block; (4) a processor, e.g., an ESP (embedded standard product); (5) an embedded programmable logic block; and (6) interconnect. RapidChip™ developed by LSI Logic Corp. is an instance of a platform. The basic idea behind the platform-based design is to avoid designing and manufacturing a chip from scratch. Some portion of the chip's architecture is predefined for a specific type of application. Through extensive design reuse, the platform-based design may provide faster time-to-market and reduced design cost.

Under a platform approach, there are two distinct steps entailed in creating a final end-user product: a prefabrication step and a customization step. In a prefabrication step, a slice is built on a wafer. A slice is a pre-manufactured chip in which all silicon layers have been built, leaving the metal layers or top metal layers to be completed with the customer's unique IP. For example, RapidSlice™ developed by LSI Logic Corp. is an instance of a slice. One or more slices may be built on a single wafer. It is understood that a slice may include one or more bottom metal layers or may include no metal layers at all. In a preferred embodiment of the prefabrication step, portions of the metal layers are pre-specified to implement the pre-defined blocks of the platform and the diffusion processes are carried out in a wafer fab. The base characteristics, in terms of the IP, the processors, the memory, the interconnect, the programmable logic and the customizable transistor array, are all pre-placed in the design and pre-diffused in the slice. However, a slice is still fully decoupled because the customer has not yet introduced the function into the slice. In a customization step, the customer-designed function is merged with the pre-defined blocks and the metal layers (or late-metal components) are laid down, which couple the elements that make up the slice built in the wafer fab, and the customizable transistor array is configured and given its characteristic function. In other embodiments, early-metal steps may be part of the pre-fabricated slice to reduce the time and cost of the customization step, resulting in a platform which is more coupled and specific. It is understood that a prefabrication step and a customization step may be performed in different foundries. For example, a slice may be manufactured in one foundry. Later, in a customization step, the slice may be pulled from inventory and metalized, which gives the slice its final product characteristics in a different foundry.

A slice such as RapidSlice™ may contain several RRAMs (Reconfigurable RAMs, or Redundant RAMs, or RapidSlice™ RAMs). Each RRAM is a set of memories of the same type that are placed compactly. RRAMs include built-in testing and self-repairing components. Thus, it is desirable to provide compact custom layout algorithms for a class of modules (e.g., RRAM column controllers) found in a memory matrix (e.g., a RRAM memory matrix).

SUMMARY OF THE INVENTION

In an exemplary aspect, the present invention provides a layout method for a top module including instances of a base module in a memory matrix such as a RRAM memory matrix, and the like. For example, the top module may be a RRAM column controller. Throughout the present application, a top module is a concept relative to a base module and is a module including instances of a base module. It is understood that the terminology "top module" does not have a connotation of being physically on top of a base module and does not imply any physical relationship between a top module and a base module (or an instance of a base module). In one embodiment, the top module and the base module may each include data pins and at least one control pin. Alternatively, the top module and the base module may each include data pins only and may not include any control pins. The data pins of the instances of the base module are replicated in the top module. When at least one control pin is included in the top module and the base module, a control signal may be shared among the instances of the base module and the top module by tying together corresponding control pins of the instances and a corresponding control pin of the top module. The present method may include steps as follows. At a library preparation stage, data pins (and control pins, if applicable) of standard cells in the top module are extended vertically for easy access. Then, positions for the data pins of the top module (and at least one control pin, if applicable) of the top module are assigned in the top module. The instances are arranged within the top module. Signal routing for the instances and the top module are implemented. Power routing is performed for the instances and the top module.

It is to be understood that both the foregoing general description and the following detailed description are exemplary and explanatory only and are not restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which.

DETAILED DESCRIPTION OF THE INVENTION

Reference will now be made in detail to the presently preferred embodiments of the invention, examples of which are illustrated in the accompanying drawings.

The present invention provides layout algorithms (placement and routing) for a class of modules (e.g., RRAM column controllers) found in a memory matrix (e.g., a RRAM memory matrix). The present invention may be applied to similar modules found in memory test structures and elsewhere without departing from the scope and spirit of the present invention.

Figure 1:
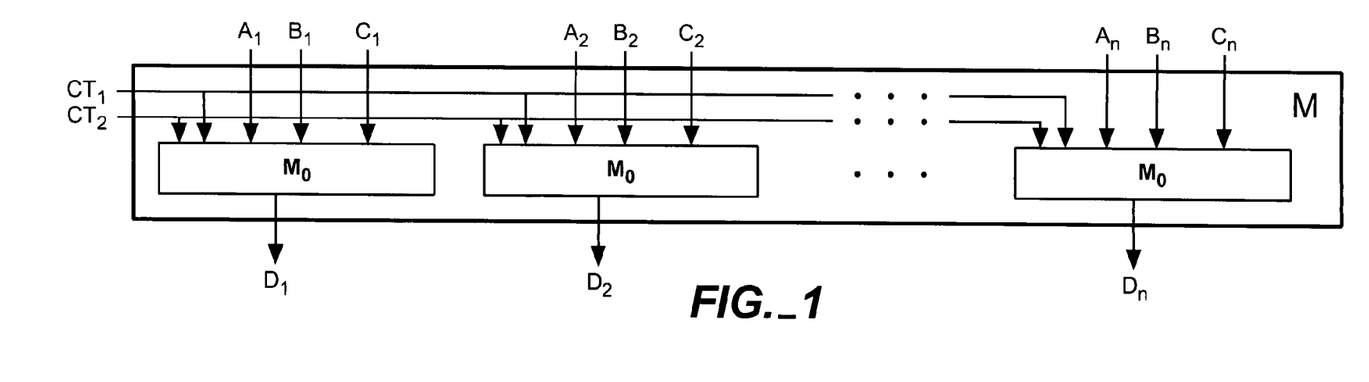
FIG. 1 is a schematic diagram of a top module including instances of a base module in accordance with an exemplary embodiment of the present invention.

The type of module M that this invention applies to is shown schematically in FIG. 1. A top module (Module M) includes multiple instances $ins_1$, $ins_2$, ..., $ins_n$, of the same module $M_0$ (hereinafter "a base module"). Throughout the present application, a top module is a concept relative to a base module and is a module including instances of a base module. It is understood that the terminology "top module" does not have a connotation of being physically on top of a base module and does not imply any physical relationship between a top module and a base module (or an instance of a base module). In one embodiment, the top module and the base module may each include data pins and at least one control pin. Alternatively, the top module and the base module may each include data pins only and may not include any control pins. As an example, the following description of the present invention concerns with the top module and the base module each including data pins and at least one control pin. However, those of ordinary skill in the art will understand that the present invention may apply to the top module and the base module each including data pins only and no control pins without departing from the scope and spirit of the present invention.

As shown in FIG. 1, there are two types of pins—data and control pins—on both the top module and the base module. Data pins from multiple instances of the base module are replicated in the top module, as shown in FIG. 1. Control signals, on the other hand, are shared among the instances of base module. Same control pins from different instances are tied together and connected to the corresponding pin on the top module (e.g., $CT_1$ or $CT_2$).

Figure 2:
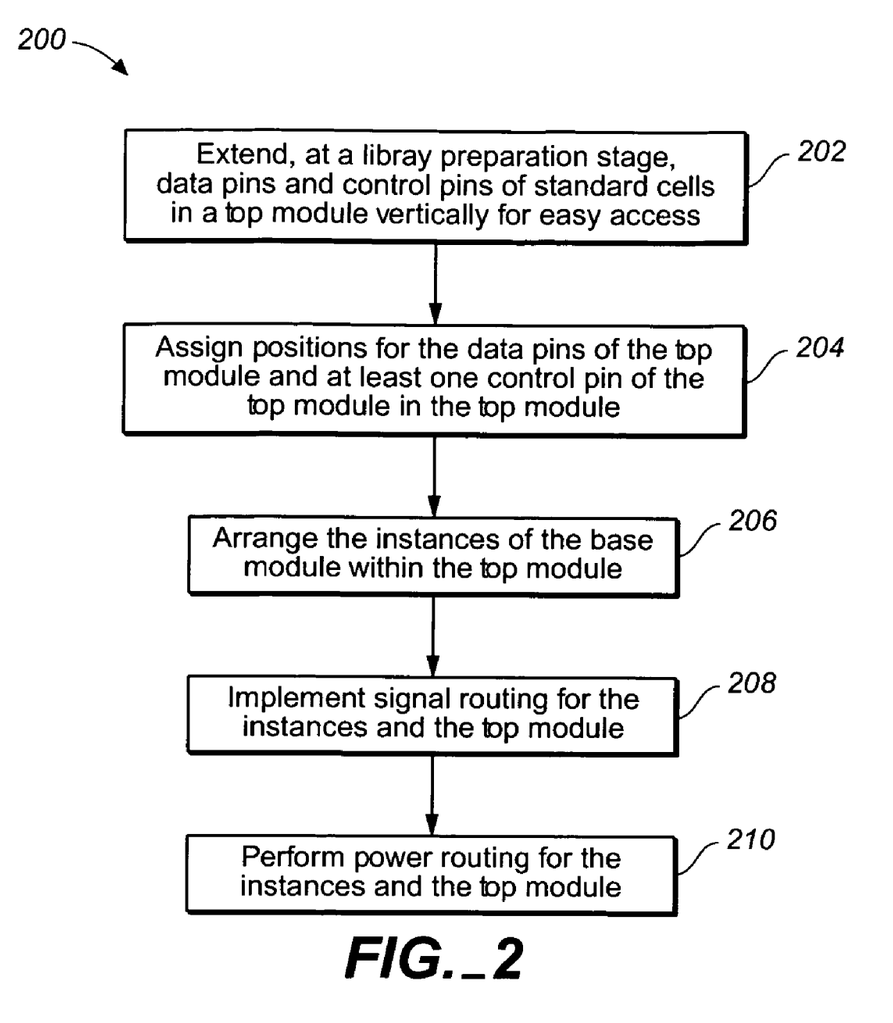
FIG. 2 is a flowchart of a layout method for a top module including instances of a base module in a memory matrix in accordance with an exemplary embodiment of the present invention.

The present invention provides algorithms and procedures for complete layout of the module M with a given overall width W. FIG. 2 is a flowchart of a layout method 200 for a top module including instances of a base module in a memory matrix in accordance with an exemplary embodiment of the present invention. The top module and the base module may each include data pins and at least one control pin. The data pins of the instances of the base module are replicated in the top module. A control signal is shared among the instances of the base module and the top module by tying together corresponding control pins of the instances and a corresponding control pin of the top module. Those of ordinary skill in the art will understand that the layout method 200 may apply to the top module and the base module each including data pins only and no control pins without departing from the scope and spirit of the present invention.

Figure 3:
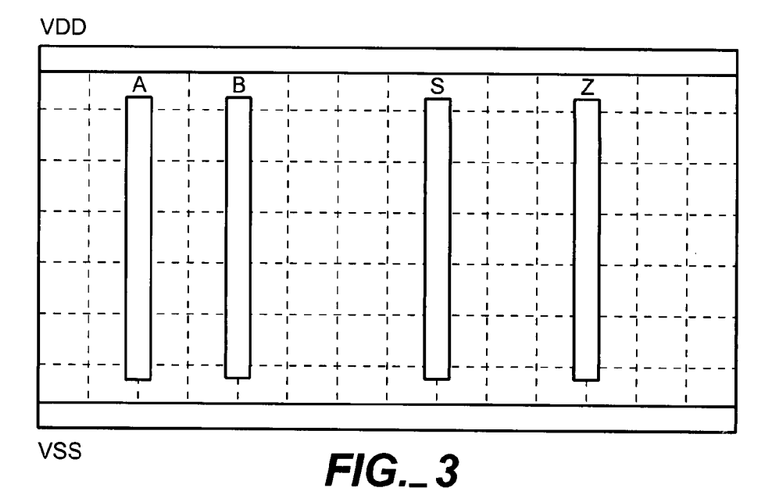
FIG. 3 is a schematic diagram illustrating a cell with four signal pins and standard power and ground pins after the signal pins are extended vertically for easy access in accordance with an exemplary embodiment of the present invention.

The method 200 may start with step 202, in which at a library preparation stage, data pins and control pins of standard cells in the top module are extended vertically for easy access. FIG. 3 shows an example of a cell with four signal pins (A, B, S, Z) and standard power and ground pins (VDD and VSS), where the four signal pins are extended vertically for easy access. A signal pin may be a data pin or a control pin. Preferably, in a library preparation stage, each standard cell is locally routed to bring all the signal pins (which are normally on the first metal layer $m_1$) up to the second metal layer $m_2$ in such a way that each signal pin occupies a different vertical routing track.

Figure 4:
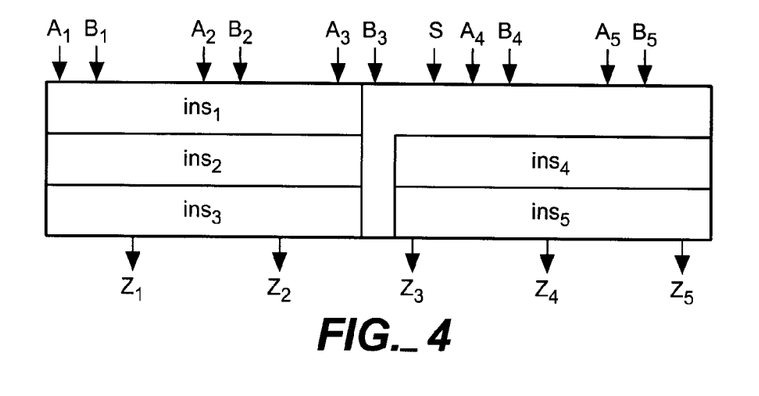
FIG. 4 is a schematic diagram illustrating a top module after positions are assigned for signal pins of the top module and instances are arranged within the top module in accordance with an exemplary embodiment of the present invention.

Referring back to FIG. 2, the positions for the data pins of the top module and the at least one control pin of the top module are assigned in the top module 204. Preferably, the step 204 may be implemented as follows. The data pins of the top module may be first grouped into a plurality of groups. Each of the plurality of groups is suitable for connecting to one of the instances. Relative positions of the data pins of the top module within each of the plurality of groups are fixed. Then, positions for the plurality of groups may be assigned uniformly across a width of the top module. Next, the at least one control pin of the top module may be assigned to at least one position available after the data pins of the top module are assigned positions. In a preferred embodiment, the at least one position assigned to the at least one control pin of the top module is around a middle of the width of the top module. For example, as shown in FIG. 4, data pins may be grouped by the instance of $M_0$ they are connected to, where $A_1$, $B_1$ and $Z_1$ are one group. $A_3$, $B_3$ and $Z_3$ are another group. Relative positions of data pins within a group may be fixed. In other words, relative positions of $A_1$, $B_1$ and $Z_1$ are the same as relative positions of $A_3$, $B_3$, and $Z_3$. The group positions are assigned uniformly across the width of the module. The control pin S may be assigned to any positions available after the data pin assignment. However, since the control pin S carries a global signal, a preferred position for it is around the middle (see FIG. 4) for delay balancing purpose.

Referring back to FIG. 2, the instances are arranged within the top module 206. Preferably, the step 206 is implemented as follows. The top module is first divided into cell rows and as many columns as can possibly fit within the width of the top module. Each of the instances is capable of being placed within one of the cell rows. Each of the cell rows has a same number of routing tracks in a first direction. When data pins within one of the plurality of groups all falls within a column of the top module, the column is assigned to one of the instances to be connected to the one of the plurality of groups. When the data pins within one of the plurality of groups falls within two columns of the top module, either of the two columns may be assigned to one of the instances to be connected to the one of the plurality of groups.

The step 206 is also called cell placement. The basic idea of cell placement is to arrange instances of a base module $M_0$ in the top module. An example of cell placement and pin positions is shown in FIG. 4. Module $M_0$ has three data pins: inputs A and B, and output Z. There is one control signal S. There are 5 instances of $M_0$ in the top module. Each instance of $M_0$ may have exactly the same internal placement, with all its cells placed in one standard cell row without horizontal gaps. During the cell placement, one may initially cut as many columns as can possibly fit within the given width W of the top module, and distribute these columns evenly in the horizontal direction. For example, the top module shown in FIG. 4 is divided into two columns (left column and right column). Since the data pins $A_1$, $B_1$ and $Z_1$ belonging to a data pin group all fall within the left column, $ins_1$ to be connected to the data pin group including $A_1$, $B_1$ and $Z_1$ may be assigned to the left column. Since the data pins $A_3$, $B_3$ and $Z_3$ belonging to a data pin group fall within the left column and the right column, $ins_3$ to be connected to the data pin group including $A_3$, $B_3$ and $Z_3$ may be assigned to either the left column or the right column. In FIG. 4, $ins_3$, which is assigned to the left column, may also be assigned to the right column. When data pins belonging to a data pin group fall within two columns, there is a possibility of a conflict between routing wires for different $M_0$ instances. This may become clearer when the routing procedure is described later. However, the basic issue may be observed on the example of signal $Z_3$ in FIG. 4, where routing has to go partially over $ins_5$ in order to reach $ins_3$. As indicated earlier, $M_0$ is assumed to be a small module suitable for being placed within one standard cell row. Using dynamic programming technique or an exhaustive search, the foregoing described routing conflict may be avoided. However, if such conflict cannot be avoided, one may reduce the number of columns by one and repeat the step 206.

Referring back to FIG. 2, signal routing for the instances and the top module are implemented 208. Preferably, the step 208 is implemented as follows. The routing tracks in the first direction are first assigned to the data pins of the instances, to internal nets of the instances, and to the least one control pin of the instances. Preferably, when the number of routing tracks in the first direction is not sufficient for the data pins of the instances and the internal nets of the instances, additional routing tracks may be gained by spacing the cell rows apart and extending cell pins vertically. Then, routing is performing for one of the internal nets using a wire in the first direction on a third metal layer $m_3$ placed on a routing track in the first direction assigned to the one of the internal nets. Routing is performed for one of the data pins of the instances using a fourth metal layer $m_4$ wire in a second direction at least substantially perpendicular to the first direction and a third metal layer $m_3$ wire in the first direction from the one of the data pins of the instances. Next, the at least one control pin of the instances may be routed using wires in the second metal layer $m_2$.

Figure 5:
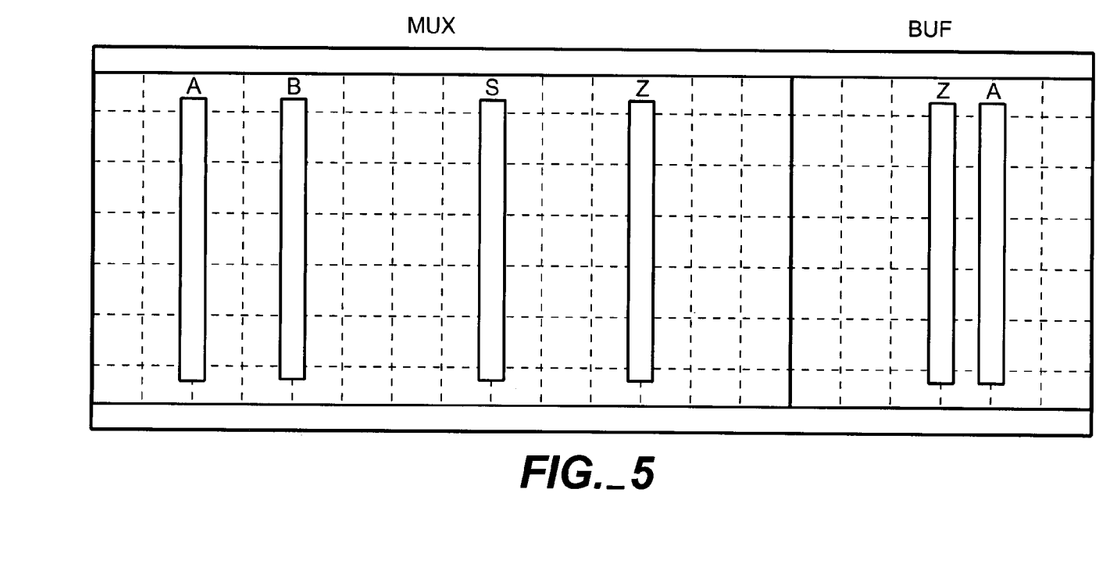
FIG. 5 is a schematic diagram illustrating a base module including a multiplexer MUX and a buffer BUF which buffers the output of MUX in accordance with an exemplary embodiment of the present invention.
Figure 6:
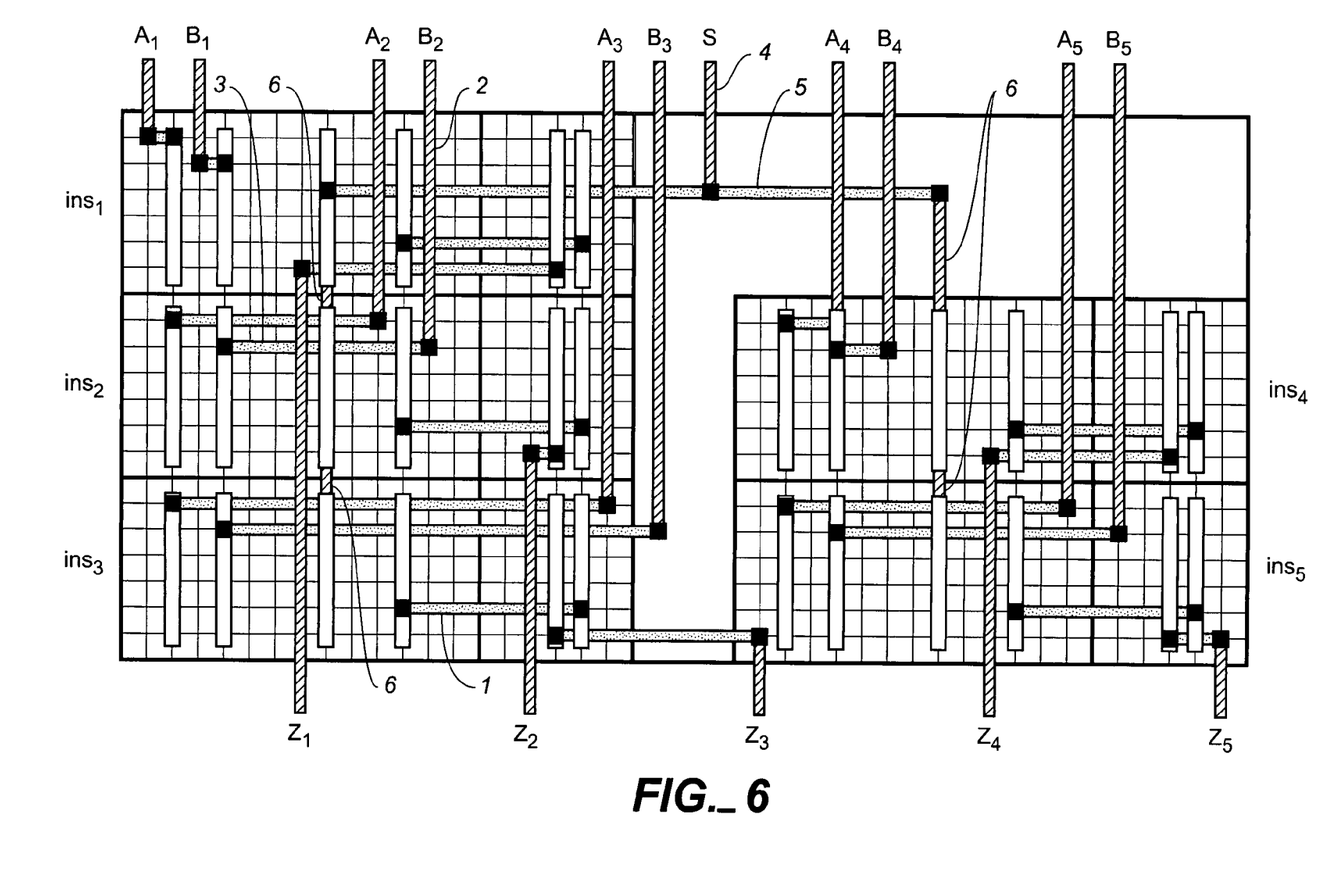
FIG. 6 is a schematic diagram illustrating a result after signal routing is implemented inside the top module shown in FIG. 4 which includes instances of the base module shown in FIG. 5 in accordance with an exemplary embodiment of the present invention.

The step 208 will be illustrated using an example. Assume that the base module $M_0$ includes a multiplexer MUX and a buffer BUF which buffers the output of MUX (FIG. 5). Inputs A and B of $M_0$ are directly connected to inputs A and B of MUX, and output Z of $M_0$ is connected to output Z of BUF. Output Z of MUX is connected to input A of BUF. Control signal S is connected to S pin of MUX. FIG. 6 shows the result after the step 208 is implemented, where the black square indicates connection. The detailed description on how the result shown in FIG. 6 is obtained is now in order. Each cell row has the same number of horizontal routing tracks (in FIG. 6 there are 6). These tracks are assigned to data pins and to internal $M_0$ nets. As shown in FIG. 6, the top two tracks in each cell row are assigned to data pins A and B. The bottom track in each cell row is assigned to data pin Z. The second track from the bottom in each row is assigned to the internal net MUX/Z-BUF/A. If the number of tracks inside a row is not sufficient for the assignment, additional tracks may be gained by spacing cell rows apart and extending cell pins in vertical direction accordingly. The present routing scheme involves the second, third, and fourth routing (metal) layer, commonly denoted as $m_2$, $m_3$, and $m_4$, respectively. Internal $M_0$ nets may be routed using a straight horizontal wire on $m_3$ (wire 1 in FIG. 6) placed on the track assigned to this particular net. Data pins may be routed using a vertical $m_4$ wire from the top level port (wire 2 in FIG. 6) and a horizontal $m_3$ wire from the corresponding pin (wire 3 in FIG. 6). The $m_3$ wire may be placed on the track assigned to this particular data pin. After data pin and internal net routing, there may be several routing tracks available in each row. In FIG. 6, there are 2 tracks left in each row. These tracks may be used for control signal routing. If there are more control signals than available tracks, one may extend the overall module vertical outline to gain additional resources. In FIG. 6, there is only one control signal S and one may assign it to the first available track in the first row. Since the internal placement of each instance of $M_0$ is the same, all the pins within one column that connect to the control signal S have exactly the same horizontal coordinate. This enables the routing of control signal S to use a "comb" scheme. As shown in FIG. 6, the routing may include a vertical $m_4$ wire from the top level port (wire 4), horizontal $m_3$ wires on the track previously assigned (wire 5) and a set of vertical $m_2$ wires that connect pins within each column (wires 6).

Figure 7:
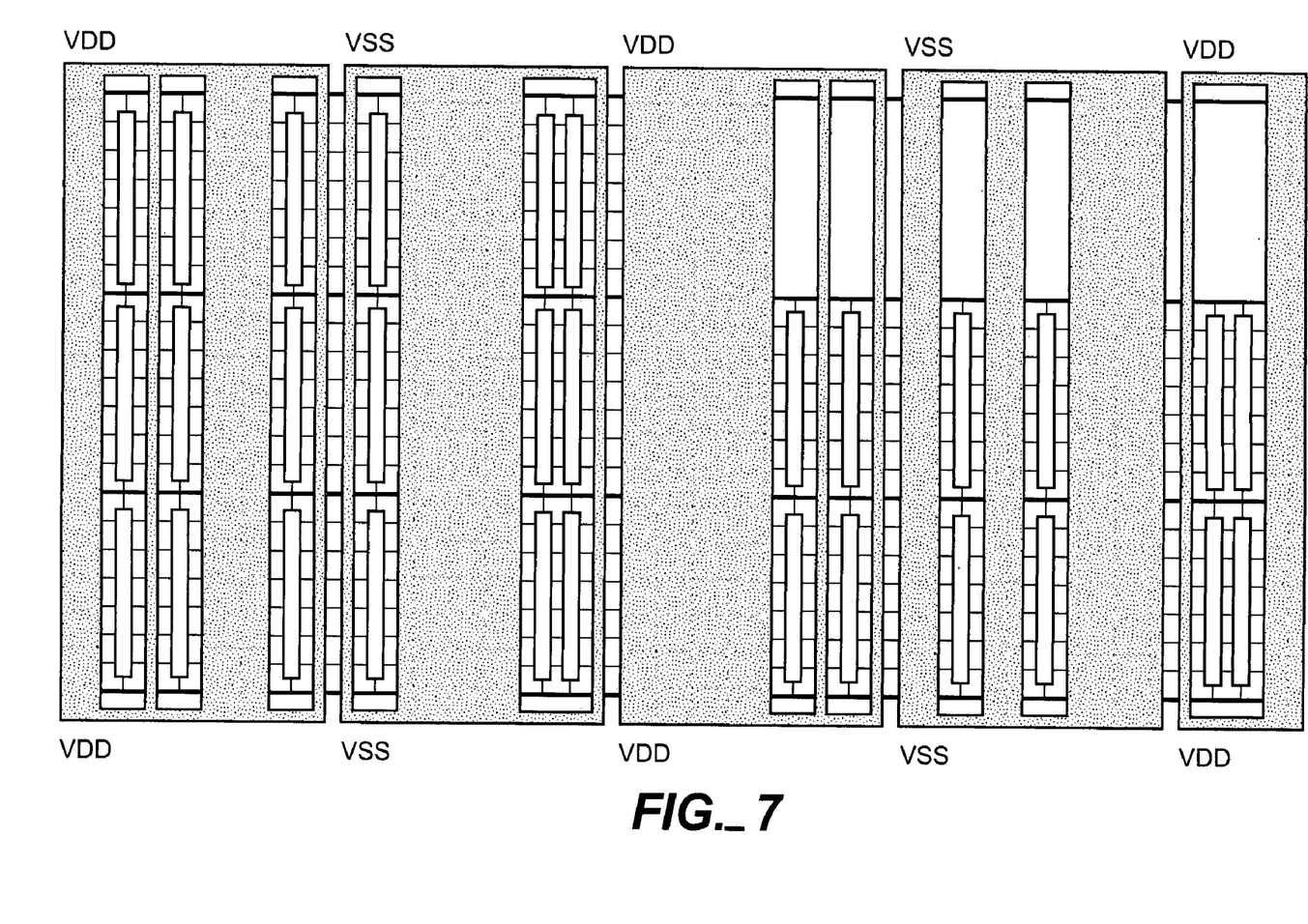
FIG. 7 is a schematic diagram illustrating a result after power routing is performed for the top module and the instances of the base module shown in FIG. 6 in accordance with an exemplary embodiment of the present invention.

Now referring back to FIG. 2, power routing is performed for the instances and the top module 210. Preferably, power routing is performed using all $m_2$ tracks in the second direction not occupied by cell pins. Referring to FIG. 6, the present signal routing scheme does not block any additional $m_2$ vertical tracks, since the only time $m_2$ wires have been used is in control signal routing (wires 6). Vertical tracks may be assigned to VDD and VSS, alternating a certain number (e.g., 10) of VDD tracks with the same number of VSS tracks. At each side (top and bottom) of the module, one may create VDD and VSS pins on $m_2$ to match vertical track assignment. In each free vertical track, one may put vertical $m_2$ wire on either VDD or VSS, depending on the assignment. This wire may span between pins on the bottom and on the top. At the end, one may merge neighboring wires in each group. The result of the power routing is shown in FIG. 7. As shown in FIG. 7, a single group of VDD (or VSS wires) may serve as a power mesh line and may be used as such when integrating this top module into the top level design. The number of tracks in one group may be selected to match the power grid pitch in the design.

It is to be noted that the above described embodiments according to the present invention may be conveniently implemented using conventional general purpose digital computers programmed according to the teachings of the present specification, as will be apparent to those skilled in the computer art. Appropriate software coding may readily be prepared by skilled programmers based on the teachings of the present disclosure, as will be apparent to those skilled in the software art.

It is to be understood that the present invention may be conveniently implemented in forms of software package. Such a software package may be a computer program product which employs a computer-readable medium including stored computer code which is used to program a computer to perform the disclosed function and process of the present invention. The computer-readable medium may include, but is not limited to, any type of conventional floppy disks, optical disks, CD-ROMS, magneto-optical disks, ROMs, RAMs, EPROMs, EEPROMs, magnetic or optical cards, or any other suitable media for storing electronic instructions.

It is understood that the specific order or hierarchy of steps in the processes disclosed is an example of exemplary approaches. Based upon design preferences, it is understood that the specific order or hierarchy of steps in the processes may be rearranged while remaining within the scope of the present invention. The accompanying method claims present elements of the various steps in a sample order, and are not meant to be limited to the specific order or hierarchy presented.

It is believed that the present invention and many of its attendant advantages will be understood by the foregoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:

1. A layout method for a top module including instances of a base module in a memory matrix, said top module and said base module each including data pins and at least one control pin, data pins of said instances being replicated in said top module, a control signal being shared among said instances and said top module by tying together corresponding control pins of said instances and a corresponding control pin of said top module, comprising steps of:
   extending, at a library preparation stage, data pins and control pins of standard cells in said top module vertically for easy access;
   assigning positions for said data pins of said top module and said at least one control pin of said top module in said top module;
   arranging said instances within said top module;
   implementing signal routing for said instances and said top module; and
   performing power routing for said instances and said top module,
   wherein said assigning step comprises:
      grouping said data pins of said top module into a plurality of groups, each of said plurality of groups being suitable for connecting to one of said instances, relative positions of said data pins of said top module within said each of said plurality of groups being fixed;
      assigning positions for said plurality of groups uniformly across a width of said top module; and
      assigning said at least one control pin of said top module to at least one position available after said data pins of said top module are assigned positions.

2. The layout method of claim 1, wherein said extending step comprises:
   locally routing said standard cells to bring said data pins and control pins of said standard cells up to a second metal layer $m_2$ such that each data pin or control pin of said standard cells occupies a different vertical routing track.

3. The layout method of claim 1, wherein said at least one position assigned to said at least one control pin of said top module is around a middle of said width of said top module.

4. The layout method of claim 1, wherein said arranging step comprises:
   dividing said top module into cell rows and as many columns as fit within said width of said top module, each of said instances capable of being placed within one of said cell rows, each of said cell rows having a same number of routing tracks in a first direction;
   assigning, when data pins within one of said plurality of groups all falls within a column of said top module, one of said instances to be connected to said one of said plurality of groups to said column; and
   assigning, when said data pins within one of said plurality of groups falls within two columns of said top module, one of said instances to be connected to said one of said plurality of groups to either of said two columns.

5. The layout method of claim 4, wherein said implementing step comprises:
   assigning said routing tracks in said first direction to said data pins of said instances, to internal nets of said instances, and to said least one control pin of said instances;
   routing one of said internal nets using a wire in said first direction on a third metal layer $m_3$ placed on a routing track in said first direction assigned to said one of said internal nets;
   routing one of said data pins of said instances using a fourth metal layer $m_4$ wire in a second direction at least substantially perpendicular to said first direction and a third metal layer $m_3$ wire in said first direction from said one of said data pins of said instances; and
   routing said at least one control pin of said instances using wires in said second metal layer $m_2$.

6. The layout method of claim 5, wherein said implementing step further comprises:
   when said number of routing tracks in said first direction is not sufficient for said data pins of said instances and said internal nets of said instances, spacing said cell rows apart and extending cell pins vertically to gain additional routing tracks.

7. The layout method of claim 5, wherein said performing step comprises using all $m_2$ tracks in said second direction not occupied by cell pins for said power routing.

8. A system for performing a layout method of a top module including instances of a base module in a memory matrix, said top module and said base module each including data pins and at least one control pin, data pins of said instances being replicated in said top module, a control signal being shared among said instances and said top module by tying together corresponding control pins of said instances and a corresponding control pin of said top module, comprising:
   means for extending, at a library preparation stage, data pins and control pins of standard cells in said top module vertically for easy access;
   means for assigning positions for said data pins of said top module and said at least one control pin of said top module in said top module;
   means for arranging said instances within said top module;
   means for implementing signal routing for said instances and said top module; and
   means for performing power routing for said instances and said top modules,
   wherein said means for assigning comprises:
      means for grouping said data pins of said top module into a plurality of groups, each of said plurality of groups being suitable for connecting to one of said instances, relative positions of said data pins of said top module within said each of said plurality of groups being fixed;

means for assigning positions for said plurality of groups uniformly across a width of said top module; and means for assigning said at least one control pin of said top module to at least one position available after said data pins of said top module are assigned positions.

9. The system of claim 8, wherein means for extending comprises:

means for locally routing said standard cells to bring said data pins and control pins of said standard cells up to a second metal layer $m_2$ such that each data pin or control pin of said standard cells occupies a different vertical routing track.

10. The system of claim 8, wherein said at least one position assigned to said at least one control pin of said top module is around a middle of said width of said top module.

11. The system of claim 8, wherein said means for arranging comprises:

means for dividing said top module into cell rows and as many columns as fit within said width of said top module, each of said instances capable of being placed within one of said cell rows, each of said cell rows having a same number of routing tracks in a first direction;

means for assigning, when data pins within one of said plurality of groups all falls within a column of said top module, one of said instances to be connected to said one of said plurality of groups to said column; and means for assigning, when said data pins within one of said plurality of groups falls within two columns of said top module, one of said instances to be connected to said one of said plurality of groups to either of said two columns.

12. The system of claim 11, wherein said means for implementing comprises:

means for assigning said routing tracks in said first direction to said data pins of said instances, to internal nets of said instances, and to said least one control pin of said instances;

means for routing one of said internal nets using a wire in said first direction on a third metal layer $m_3$ placed on a routing track in said first direction assigned to said one of said internal nets;

means for routing one of said data pins of said instances using a fourth metal layer $m_4$ wire in a second direction at least substantially perpendicular to said first direction and a third metal layer $m_3$ wire in said first direction from said one of said data pins of said instances; and means for routing said at least one control pin of said instances using wires in said second metal layer $m_2$.

13. The system of claim 12, wherein said means for implementing further comprises:

when said number of routing tracks in said first direction is not sufficient for said data pins of said instances and said internal nets of said instances, means for spacing said cell rows apart and extending cell pins vertically to gain additional routing tracks.

14. The system of claim 12, wherein said means for performing comprises means for using all $m_2$ tracks in said second direction not occupied by cell pins for said power routing.

15. A computer-readable medium having computer-executable instructions for performing a layout method of a top module including instances of a base module in a memory matrix, said top module and said base module each including data pins and at least one control pin, data pins of said instances being replicated in said top module, a control signal being shared among said instances and said top module by tying together corresponding control pins of said instances and a corresponding control pin of said top module, said layout method comprising steps of:

extending, at a library preparation stage, data pins and control pins of standard cells in said top module vertically for easy access;

assigning positions for said data pins of said top module and said at least one control pin of said top module in said top module;

arranging said instances within said top module;

implementing signal routing for said instances and said top module; and performing power routing for said instances and said top module, wherein said assigning step comprises:

grouping said data pins of said top module into a plurality of groups, each of said plurality of groups being suitable for connecting to one of said instances, relative positions of said data pins of said top module within said each of said plurality of groups being fixed;

assigning positions for said plurality of groups uniformly across a width of said top module; and assigning said at least one control pin of said top module to at least one position available after said data pins of said top module are assigned positions.

16. The computer-readable medium of claim 15, wherein said extending step comprises:

locally routing said standard cells to bring said data pins and control pins of said standard cells up to a second metal layer $m_2$ such that each data pin or control pin of said standard cells occupies a different vertical routing track.

17. The computer-readable medium of claim 15, wherein said at least one position assigned to said at least one control pin of said top module is around a middle of said width of said top module.

18. The computer-readable medium of claim 15, wherein said arranging step comprises:

dividing said top module into cell rows and as many columns as fit within said width of said top module, each of said instances capable of being placed within one of said cell rows, each of said cell rows having a same number of routing tracks in a first direction;

assigning, when data pins within one of said plurality of groups all falls within a column of said top module, one of said instances to be connected to said one of said plurality of groups to said column; and assigning, when said data pins within one of said plurality of groups falls within two columns of said top module, one of said instances to be connected to said one of said plurality of groups to either of said two columns.

19. The computer-readable medium of claim 18, wherein said implementing step comprises:

assigning said routing tracks in said first direction to said data pins of said instances, to internal nets of said instances, and to said least one control pin of said instances;

routing one of said internal nets using a wire in said first direction on a third metal layer $m_3$ placed on a routing track in said first direction assigned to said one of said internal nets;

routing one of said data pins of said instances using a fourth metal layer $m_4$ wire in a second direction at least substantially perpendicular to said first direction and a third metal layer $m_3$ wire in said first direction from said one of said data pins of said instances; and routing said at least one control pin of said instances using wires in said second metal layer $m_2$.

20. The computer-readable medium of claim 19, wherein said implementing step further comprises:

when said number of routing tracks in said first direction is not sufficient for said data pins of said instances and said internal nets of said instances, spacing said cell rows apart and extending cell pins vertically to gain additional routing tracks.

21. The computer-readable medium of claim 19, wherein said performing step comprises using all $m_2$ tracks in said second direction not occupied by cell pins for said power routing.

22. A layout method for a top module including instances of a base module in a memory matrix, said top module and said base module each including data pins, data pins of said instances being replicated in said top module, comprising steps of:

extending, at a library preparation stage, data pins of standard cells in said top module vertically for easy access;

assigning positions for said data pins of said top module in said top module;

arranging said instances within said top module;

implementing signal routing for said instances and said top module; and performing power routing for said instances and said top module, wherein said assigning step comprises:

grouping said data pins of said top module into a plurality of groups, each of said plurality of groups being suitable for connecting to one of said instances, relative positions of said data pins of said top module within said each of said plurality of groups being fixed; and assigning positions for said plurality of groups uniformly across a width of said top module.

23. The layout method of claim 22, wherein said extending step comprises:

locally routing said standard cells to bring said data pins of said standard cells up to a second metal layer $m_2$ such that each data pin of said standard cells occupies a different vertical routing track.

24. The layout method of claim 22, wherein said arranging step comprises:

dividing said top module into cell rows and as many columns as fit within said width of said top module, each of said instances capable of being placed within one of said cell rows, each of said cell rows having a same number of routing tracks in a first direction;

assigning, when data pins within one of said plurality of groups all falls within a column of said top module, one of said instances to be connected to said one of said plurality of groups to said column; and assigning, when said data pins within one of said plurality of groups falls within two columns of said top module, one of said instances to be connected to said one of said plurality of groups to either of said two columns.

25. The layout method of claim 24, wherein said implementing step comprises:

assigning said routing tracks in said first direction to said data pins of said instances and to internal nets of said instances;

routing one of said internal nets using a wire in said first direction on a third metal layer $m_3$ placed on a routing track in said first direction assigned to said one of said internal nets; and routing one of said data pins of said instances using a fourth metal layer $m_4$ wire in a second direction at least substantially perpendicular to said first direction and a third metal layer $m_3$ wire in said first direction from said one of said data pins of said instances.

26. The layout method of claim 25, wherein said implementing step further comprises:

when said number of routing tracks in said first direction is not sufficient for said data pins of said instances and said internal nets of said instances, spacing said cell rows apart and extending cell pins vertically to gain additional routing tracks.

27. The layout method of claim 25, wherein said performing step comprises using all $m_2$ tracks in said second direction not occupied by cell pins for said power routing.

* * * * *